US006011692A

United States Patent [19]
Bergstedt et al.

[11] Patent Number: 6,011,692
[45] Date of Patent: Jan. 4, 2000

[54] CHIP SUPPORTING ELEMENT

[75] Inventors: Leif Bergstedt, Sjömarken; Ros-Marie Lundh, Gothenburg, both of Sweden

[73] Assignee: Telefonaktiebolaget LM Ericsson, Stockholm, Sweden

[21] Appl. No.: 09/139,146

[22] Filed: Aug. 24, 1998

[30] Foreign Application Priority Data

Aug. 25, 1997 [SE] Sweden ................................. 9703061

[51] Int. Cl.[7] .................................................... H05K 7/20
[52] U.S. Cl. ........................ 361/707; 361/704; 361/705; 361/707; 361/807; 257/707; 174/260
[58] Field of Search .................................... 361/205, 707, 361/748, 758, 751, 761, 764, 767, 770, 771, 783; 257/707, 679, 729, 731, 207, 607; 174/260, 252

[56] References Cited

U.S. PATENT DOCUMENTS

| 4,413,308 | 11/1983 | Brown . | |
|---|---|---|---|
| 4,649,418 | 3/1987 | Uden | 257/679 |
| 5,099,392 | 3/1992 | Miller et al. | 361/760 |
| 5,289,337 | 2/1994 | Aghazadeh et al. | 361/718 |
| 5,586,010 | 12/1996 | Murtuza et al. | 361/751 |

FOREIGN PATENT DOCUMENTS

| 0 231 937 | 8/1987 | European Pat. Off. . |
| 296 21 837 | 4/1987 | Germany . |
| 91/01533 | 2/1991 | WIPO . |

OTHER PUBLICATIONS

Abstract of JP 61–145696 from Patent Abstracts of Japan, vol. 10, No. 344 (P–518), Jul. 1986.

*Primary Examiner*—Leo P. Picard
*Assistant Examiner*—Boris L. Chervinsky
*Attorney, Agent, or Firm*—Burns, Doane, Swecker & Mathis, L.L.P.

[57] ABSTRACT

A chip support element includes a ductile foil of electrically and thermally conducting material having a stabilizing frame around the site where at least one chip is to be fixed to the foil.

3 Claims, 1 Drawing Sheet

CHIP SUPPORTING ELEMENT

This application claims priority under 35 U.S.C. §§ 119 and/or 365 to Application Ser. No. 9703061-3 filed in Sweden on Aug. 25, 1997; the entire content of which is hereby incorporated by reference.

TECHNICAL FIELD

The invention relates to an element for supporting one or more chips to facilitate the mounting thereof on circuit boards.

BACKGROUND

A conventional chip module comprises a chip supporting element, i.e. a mechanical support for the chip, electrical connections to the chip, and heat dissipating surfaces for the chip. Thus, the known chip modules comprise all necessary infrastructure for the chip, which makes them quite expensive.

In many applications, such as low-power applications, all that infrastructure may not even be needed.

Moreover, conventional chip modules to be mounted with "floating" chips are often provided with some kind of plastic material as an intermediate medium, which makes them unsuitable to dissipate heat. An example hereof is disclosed in U.S. Pat. No. 4,413,308 where terminals on a chip carrier are connected to conductors on a flexible printed wiring sheet.

SUMMARY

The object of the invention is to bring about a chip supporting element which is simpler and, thereby, cheaper to produce than known such elements.

This is attained by means of the chip supporting element according to the invention in that it comprises a ductile foil of electrically and thermally conducting material, and a stabilizing frame of dielectric material fixed to the foil around the site where at least one chip is to be located in contact with the foil.

For low-power applications, the chip supporting element according to the invention, provided with at least one chip, would constitute a complete chip module to be mounted on a circuit board.

For high-power applications, the chip supporting element according to the invention, provided with at least one chip, would have to be fixed to a heat sink on a circuit board, e.g. a mother board.

Thus, the chip supporting element according to the invention may be used in both low-power and high-power applications, and, consequently, is more versatile than chip modules known so far.

BRIEF DESCRIPTION OF THE DRAWING

The invention will be described more in detail below with reference to the appended drawing, on which

DETAILED DESCRIPTION

Figure 1:
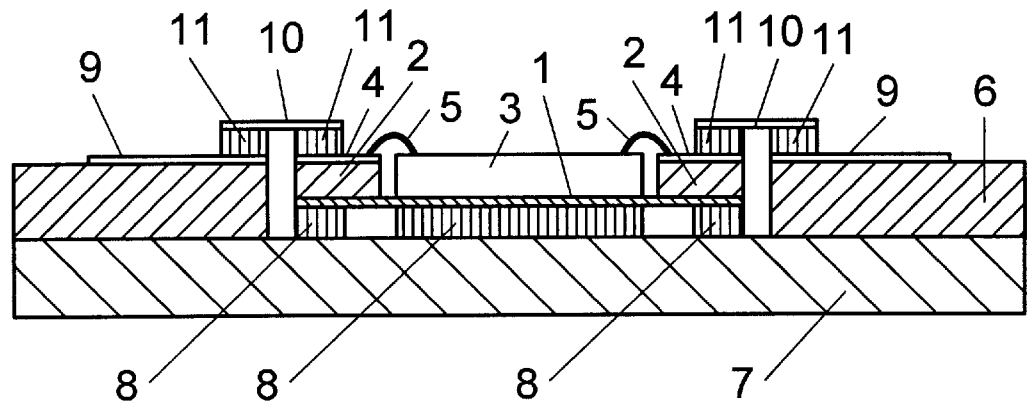
FIGS. 1 and 2 are cross-sectional views of a first and second embodiment, respectively, of a chip supporting element in accordance with the invention fitted to a circuit board.

FIG. 1 is a cross-sectional view of an embodiment of a chip supporting element in accordance with the invention, fitted to a circuit board. It should be pointed out that FIG. 1 is not to scale.

In accordance with the invention, the chip supporting element comprises a ductile foil 1 of electrically and thermally conducting material, and a stabilizing frame 2 of dielectric material, fixed to the foil 1 around a chip 3, which, in the embodiment shown in FIG. 1, is fixed with all of its underside to the foil 1.

The chip 3 to be fixed to the foil 1 may e.g. be a fragile GaAs chip for a microwave application. Thus, the foil 1 has to be ductile enough not to damage such a chip when it shrinks or expands.

The foil has a thickness of 15–75 micrometer and is preferably a metal foil, e.g. a copper foil.

In the embodiment shown in FIG. 1, the frame 2 is provided with conductors 4 which are bonded to corresponding therminals (not shown) on the chip 3 via bonding wires 5. It is, however, to be understood that the frame 2 does not necessarily have to be provided with conductors but that the electrical connections to the chip terminals can be accomplished in many other ways.

In FIG. 1, the foil 1 with the frame 2 and the chip 3 is supposed to be used in a high-power application.

For that purpose, the foil 1 with the frame 2 and the chip 3 is fitted to a circuit board in a recess in a dielectric layer 6 on a ground plane 7. The ground plane 7 comprises a layer of metal or a composite material and has a specified coefficient of thermal expansion. The foil 1 is attached to the ground plane 7 via soldered or glued junctions 8. In the embodiment shown in FIG. 1, there is one junction below the chip 3 and further junctions along the edges of the foil 1. This soldered or glued junctions 8 are of electrically and thermally conductive material in order to secure good electric contact between the foil 1 and the ground plane 7 as well as good heat dissipation from the foil, i.e. actually the chip 3, to the ground plane 7.

It should be pointed out that the soldered or glued junction 8 below the chip 3 may be left out in a low-power application of the chip supporting structure according to the invention.

In the embodiment according to FIG. 1, the dielectric layer 6 is provided with a pattern of conductors 9 which are electrically connected to the conductors 4 on the frame 2 via conductors 10 which are soldered or glued to the conductors 4 and 9 via junctions 11.

Figure 2:
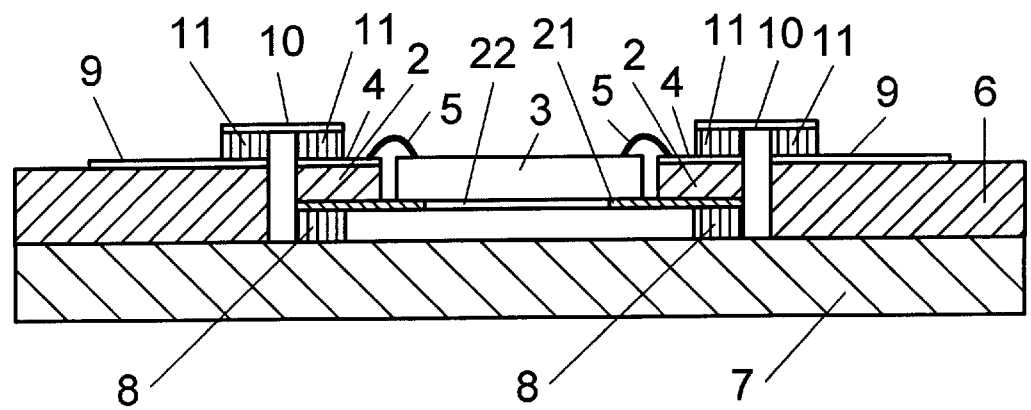

FIG. 2 shows a cross-sectional view of a second embodiment of a chip supporting element according to the invention, fitted to a circuit board. It should be pointed out that also FIG. 2 is not to scale.

Identical components in FIGS. 2 and 1 bear identical reference numerals.

FIG. 2 illustrates an example of a low-power application of the chip supporting element according to the invention.

In the embodiment according to FIG. 2, the chip supporting structure comprises a foil 21 of electrically and thermally conducting material, having an aperture 22 over which a chip 3 is fixed along its edges. As in FIG. 1, a stabilizing frame 2 of dielectric material is fixed to the foil 21 around a chip 3, and the frame 2 is provided with conductors 4 which are bonded to corresponding therminals (not shown) on the chip 3 via bonding wires 5.

Also, as in FIG. 1. the foil 21 with the frame 2 and the chip 3, is fitted in a recess in a dielectric layer 6 on a ground plane 7 via soldered or glued junctions 8.

However, in the embodiment according to FIG. 2, the foil 21 is not soldered or glued to the ground plane 7 below the chip 3 but only along the edges of the foil 21. Thus, contrary to the case in FIG. 1, the chip 3 in FIG. 2 is "floating" relative to the ground plane 7 in that it can expand and shrink, i.e. move, on the ductile foil 21. It should, however, be understood that there may be applications where there are soldered or glued junctions also between the foil 21 and the ground plane 7 around the aperture 22.

Moreover, as in FIG. 1, the dielectric layer 6 is provided with a pattern of conductors 9 which are electrically connected to the conductors 4 on the frame 2 via conductors 10 which we soldered or glued to the conductors 4 and 9 via junctions 11.

In accordance with a further, not-illustrated embodiment of the chip supporting element according to the invention, the ductile foil is provided with an aperture which is large enough to receive a chip. The chip is then fixed along its edges to the foil, e.g. by means of laser welding.

The ductile foil 1, 21 with the dielectric, stabilizing frame 2 may be supplied separately to a manufacturer for mounting of the chip 3 on the foil and bonding of the conductors 4 on the frame 2 to corresponding terminals on the chip 3 via the bonding wires 5.

As should be apparent, from the above, the chip supporting element according to invention can be used in low-power as well as high-power application. Thus, the mounting of chips on circuit boards is simplified.

What is claimed is:

1. A supporting element for an integrated circuit chip, comprising an electrically and thermally conducting ductile metal foil on which the chip is to be fixed to allow the chip to expand and shrink, and a stabilizing frame fixed to the foil around a site where the chip is to be fixed to the foil.

2. The supporting element of claim 1, wherein the foil is copper.

3. A chip module, comprising an integrated circuit chip fixed to an electrically and thermally conducting ductile metal foil for enabling the chip to expand and shrink, a stabilizing frame fixed to the foil around the chip, and connecting conductors bonded to corresponding terminals on the chip via bonding wires.

* * * * *